(12) United States Patent
Chang et al.

(10) Patent No.: US 10,157,831 B2
(45) Date of Patent: Dec. 18, 2018

(54) SEMICONDUCTOR DEVICE HAVING A CONDUCTIVE VIA STRUCTURE

(71) Applicant: TAIWAN SEMICONDUCTOR MANUFACTURING COMPANY, LTD., Hsinchu (TW)

(72) Inventors: Kuo-Chin Chang, Chiayi (TW); Yuh Chern Shieh, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 9 days.

(21) Appl. No.: 15/351,697

(22) Filed: Nov. 15, 2016

(65) Prior Publication Data

US 2017/0062329 A1    Mar. 2, 2017

Related U.S. Application Data

(60) Continuation of application No. 14/857,954, filed on Sep. 18, 2015, now Pat. No. 9,514,978, which is a
(Continued)

(51) Int. Cl.
*H01L 23/00* (2006.01)
*H01L 23/31* (2006.01)
(Continued)

(52) U.S. Cl.
CPC ...... *H01L 23/528* (2013.01); *H01L 21/76802* (2013.01); *H01L 21/76837* (2013.01); *H01L 23/3171* (2013.01); *H01L 23/5283* (2013.01); *H01L 24/03* (2013.01); *H01L 24/05* (2013.01); *H01L 24/11* (2013.01); *H01L 24/13* (2013.01); *H01L 2224/0345* (2013.01); *H01L 2224/0346* (2013.01); *H01L 2224/0391* (2013.01); *H01L 2224/03472* (2013.01); *H01L 2224/0401* (2013.01); *H01L 2224/05012* (2013.01); *H01L 2224/05016* (2013.01); *H01L 2224/05026* (2013.01); *H01L 2224/05147* (2013.01); *H01L 2224/05568* (2013.01); *H01L 2224/05571* (2013.01); *H01L 2224/05647* (2013.01); *H01L 2224/1145* (2013.01);
(Continued)

(58) Field of Classification Search
CPC .......................... H01L 23/5283; H01L 23/528
See application file for complete search history.

(56) References Cited

U.S. PATENT DOCUMENTS 5,077,598 A     12/1991  Bartelink
2010/0109158 A1  5/2010  Platz et al.

*Primary Examiner* — Amar Movva
(74) *Attorney, Agent, or Firm* — Hauptman Ham, LLP

(57) ABSTRACT

A semiconductor device includes a substrate and a contact pad over the substrate. The semiconductor device further includes a conductive via electrically connected to the contact pad. The conductive via includes a conductive via layer having a first thickness, and a first conductive layer, wherein the first conductive layer is between the contact pad and the conductive via layer. The semiconductor device further includes a conductive pillar electrically connected to the conductive via. The conductive pillar includes a conductive pillar layer having a second thickness, and a second conductive layer having outer edges substantially aligned with outer edges of the conductive pillar layer, wherein the second conductive layer is between the conductive via layer and the conductive pillar layer. A ratio of the first thickness to the second thickness ranges from about 0.33 to about 0.55.

20 Claims, 10 Drawing Sheets

Related U.S. Application Data division of application No. 13/116,201, filed on May 26, 2011, now Pat. No. 9,159,638.

(51) Int. Cl.
*H01L 21/768* (2006.01)
*H01L 23/528* (2006.01)

(52) U.S. Cl.
CPC .................. *H01L 2224/1146* (2013.01); *H01L 2224/1147* (2013.01); *H01L 2224/13006* (2013.01); *H01L 2224/13023* (2013.01); *H01L 2224/13147* (2013.01); *H01L 2924/00014* (2013.01); *H01L 2924/01012* (2013.01); *H01L 2924/01327* (2013.01); *H01L 2924/1305* (2013.01); *H01L 2924/1306* (2013.01)

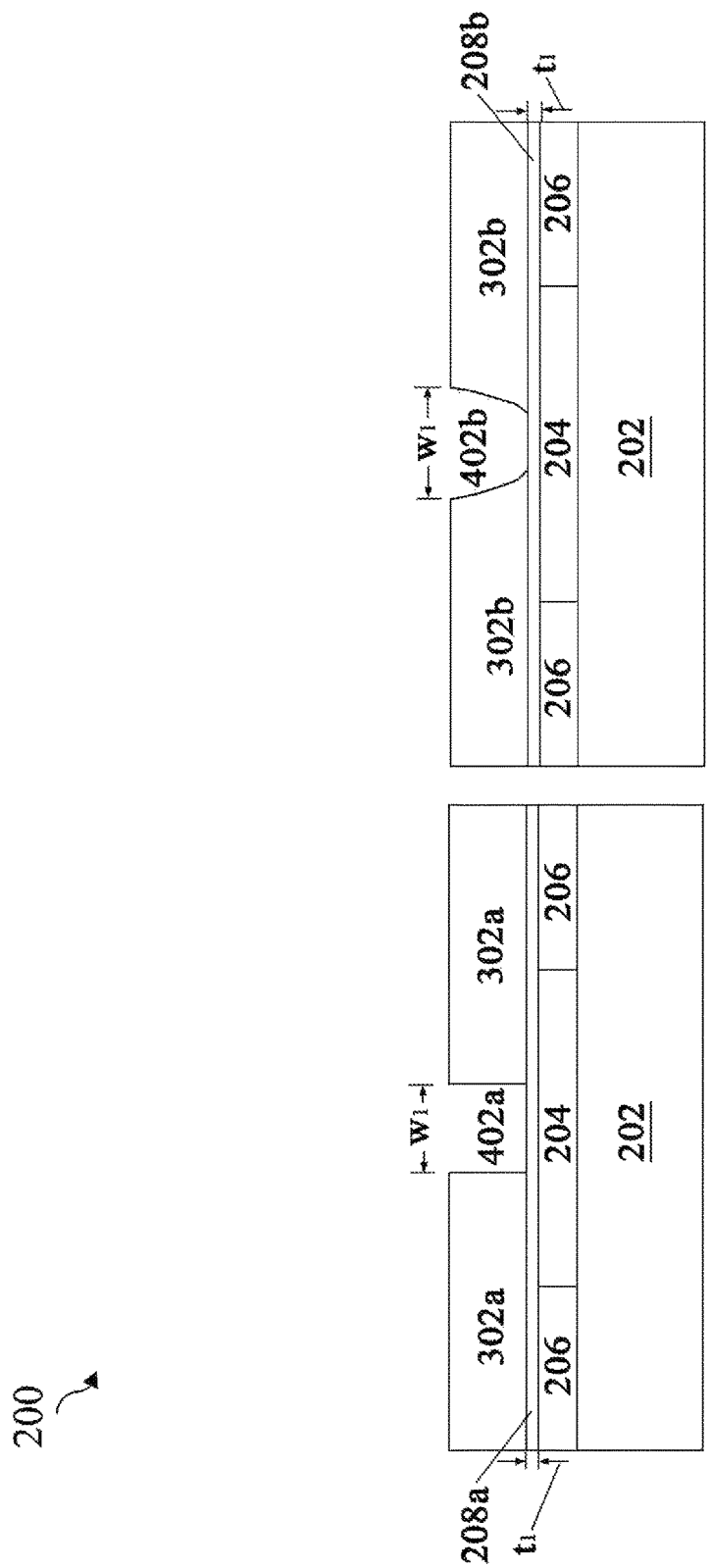

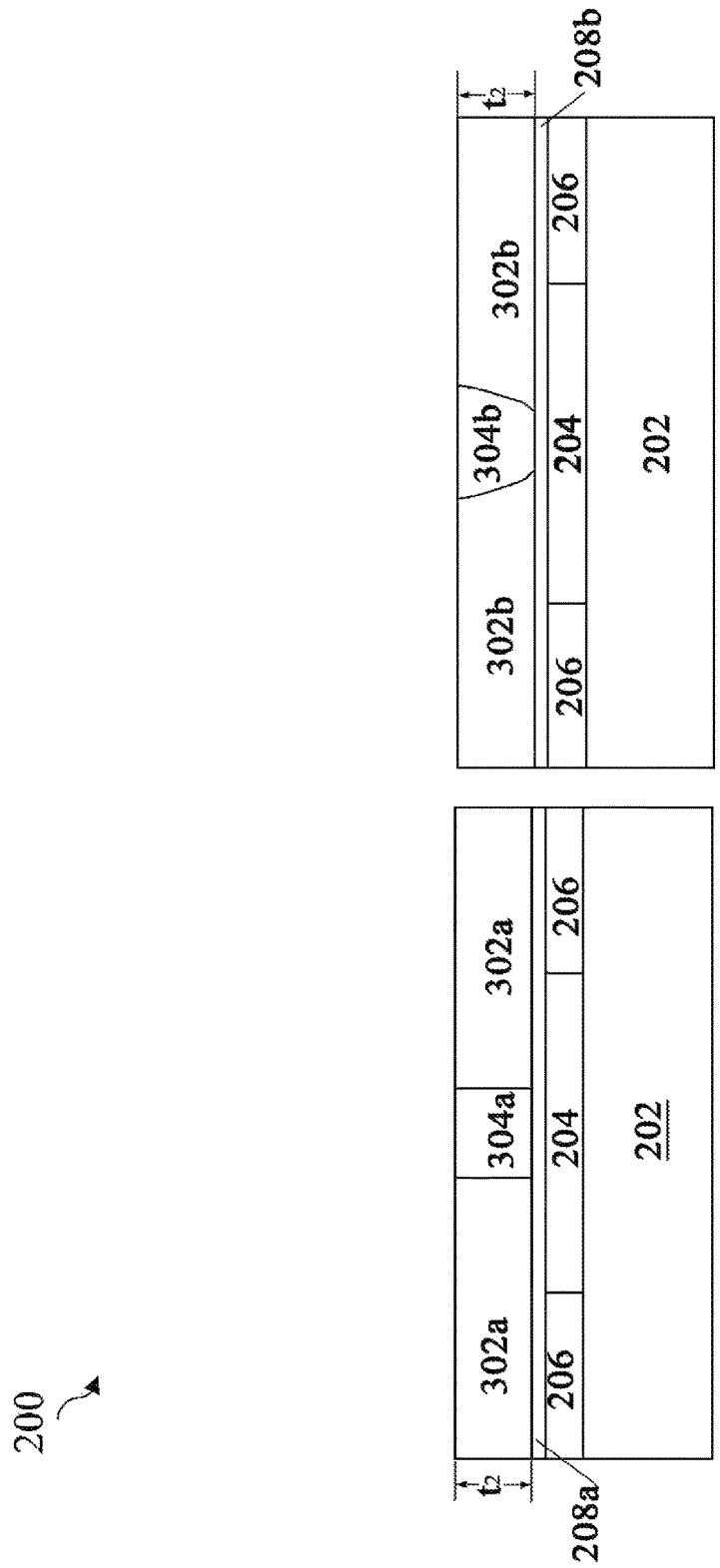

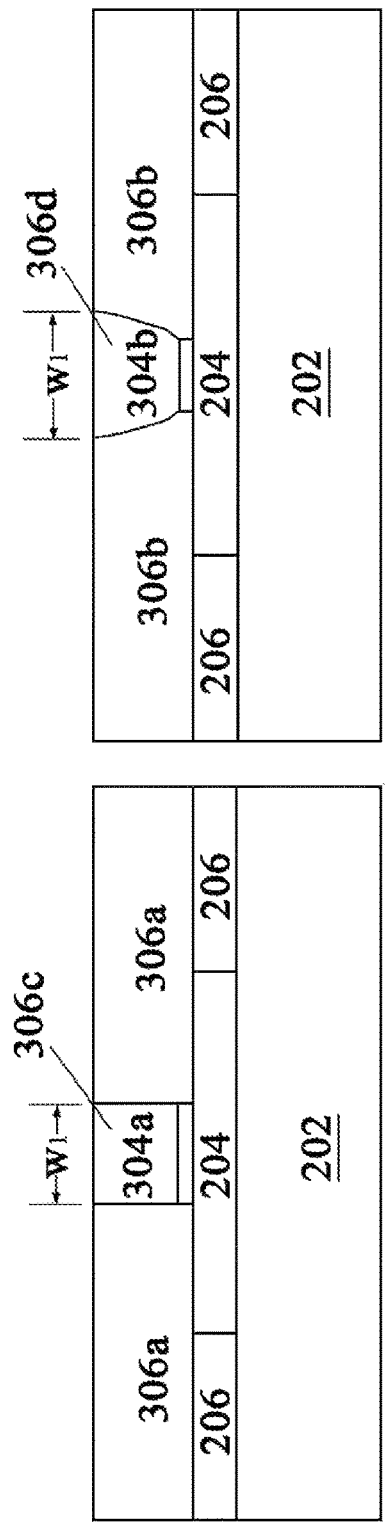

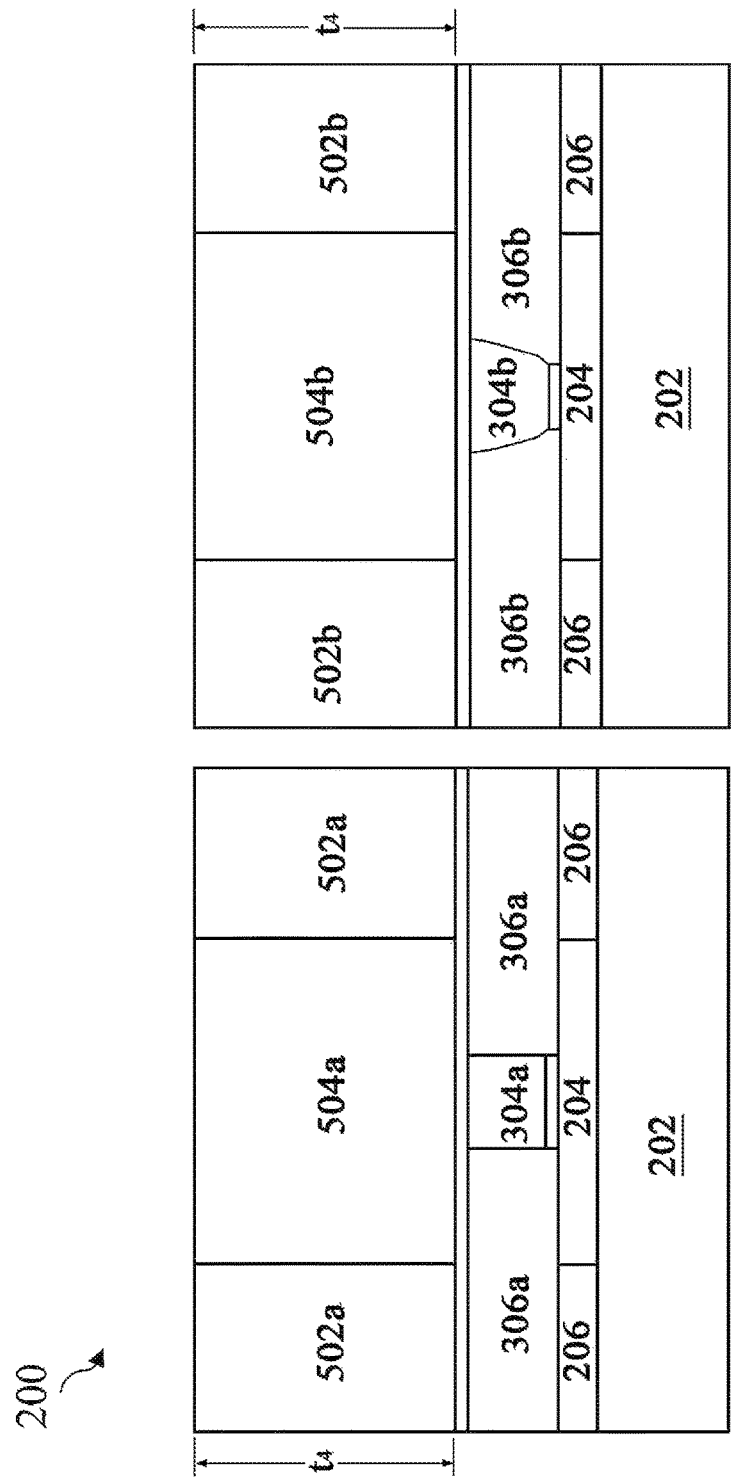

SEMICONDUCTOR DEVICE HAVING A CONDUCTIVE VIA STRUCTURE

PRIORITY CLAIM

The present application is a continuation of U.S. application Ser. No. 14/857,954, filed Sep. 18, 2015, which is a divisional of U.S. application Ser. No. 13/116,201, filed May 26, 2011, now U.S. Pat. No. 9,159,638, issued Oct. 13, 2015, which are incorporated herein by reference in their entireties.

FIELD OF THE INVENTION

The invention relates to integrated circuit fabrication and, more particularly, to a semiconductor device with a conductive via.

BACKGROUND

Modern integrated circuits (ICs) are made up of literally millions of active devices, such as diodes and transistors, and passive devices, such as inductors, capacitors and resistors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern ICs. On top of the interconnect structures, contact pads are formed on the interconnect structures and exposed on top surface of the respective chip for IC package. Electrical connections are made through contact pads to connect the chip to a package substrate or another die. Contact pads can be used for wire bonding or flip-chip bonding during IC packaging.

Flip-chip bonding utilizes bumps to establish electrical contact between a chip's contact pads and the package substrate. Structurally, a bump actually contains the bump itself and a so-called under bump metallurgy (UBM) layer located between the bump and a contact pad. An UBM layer generally comprises a diffusion barrier layer (or a glue layer) and a seed layer, arranged in that order, on the contact pad. The bumps themselves, based on the material used, are classified as solder bumps, gold bumps, copper pillar bumps and bumps with mixed metals. Recently, copper pillar bump technology has been proposed. Instead of using a solder bump, the electronic component is connected to a substrate by a copper pillar bump, which achieves finer pitch with minimum probability of bump bridging, reduces the capacitance load for the circuits, and allows the electronic component to perform at higher frequencies.

However, there are challenges to implementing such features and processes in IC fabrication. For example, delamination between an inter-metal dielectric (IMD) layer and an interconnect structure overlying the integrated circuits due to high stress from a copper pillar. Accordingly, what is needed is an improved bump structure and method of bump formation.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2, 3A, 3B, 4A, 4B, 5A, 5B, 6A, 6B, 7A, 7B, 8A, 8B, 9A and 9B show schematic cross-sectional views of a conductive via of a semiconductor device at various stages of fabrication according to various aspects of the present disclosure.

DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Figure 1:
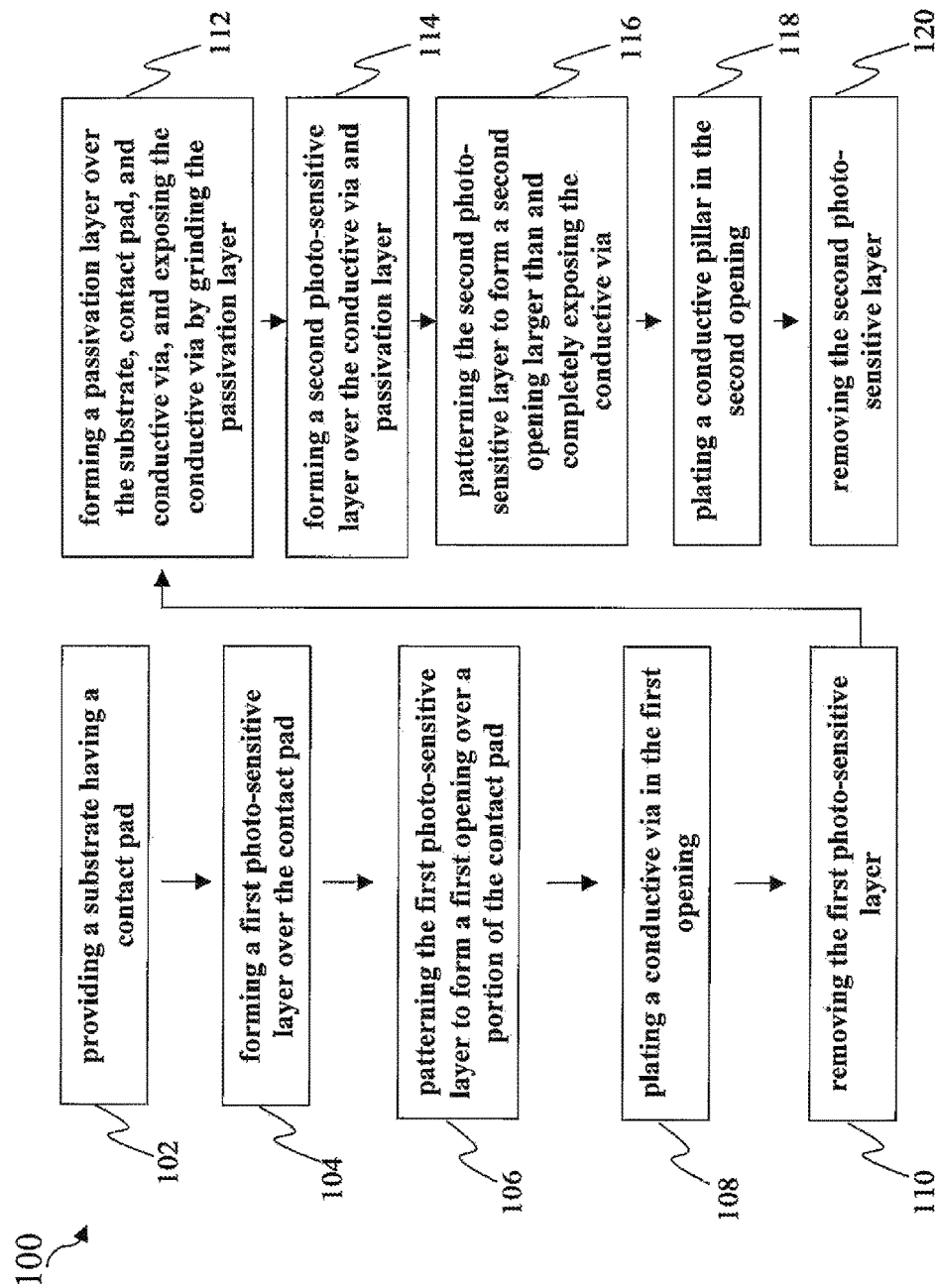
FIG. 1 is a flowchart illustrating a method for fabricating a semiconductor device comprising a conductive via according to various aspects of the present disclosure.

FIG. 1 is a flowchart illustrating a method 100 for fabricating a semiconductor device 200 comprising a conductive via 304a or 304b (shown in FIGS. 4A through 9B) according to various aspects of the present disclosure. FIGS. 2-9B show schematic cross-sectional views of a conductive via 304a or 304b of a semiconductor device 200 at various stages of fabrication according to various aspects of the present disclosure. It is understood that additional processes may be provided before, during, and after the method 100 of FIG. 1, and that some other processes may only be briefly described herein. Also, FIGS. 1 through 9B are simplified for a better understanding of the inventive concepts of the present disclosure. For example, although the figures illustrate the conductive via 304a or 304b of a semiconductor device 200, it is understood the semiconductor device 200 may be part of an integrated circuit (IC) package that further comprises a number of other components such as under-fill, lead-frame, etc.

Figure 2:

Referring to FIGS. 1 and 2, the method 100 begins at step 102 wherein a substrate 202 having a contact pad 204 is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI) or silicon on sapphire. In other embodiments, the substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 202 may comprise a multilayer silicon structure or a silicon substrate may include a multilayer compound semiconductor structure.

The substrate 202 further comprises a plurality of isolation regions (not shown). The isolation regions may utilize isolation technology, such as local oxidation of silicon (LOCOS) or shallow trench isolation (STI), to define and electrically isolate the various microelectronic elements (not shown). In the present embodiment, the isolation regions include a STI. The isolation regions may comprise silicon oxide, silicon nitride, silicon oxynitride, fluoride-doped silicate glass (FSG), a low-K dielectric material, other suitable materials, and/or combinations thereof. The isolation regions, and in the present embodiment, the STI, may be formed by any suitable process. As one example, the formation of the STI may include patterning the semiconductor substrate 202 by a conventional photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Examples of the various microelectronic elements that may be formed in the substrate 202 include transistors (e.g., p-channel/n-channel metal oxide semiconductor field effect transistors (pMOSFETs/nMOSFETs), bipolar junction transistors (BJTs), high voltage transistors, high frequency transistors, etc.); diodes; resistors; capacitors; inductors; fuses; and other suitable elements. Various processes are performed to form the various microelectronic elements including deposition, photolithography, implantation, etching, annealing, and other suitable processes. The microelectronic elements are interconnected to form the IC device, such as a logic device, memory device (e.g., static random access memory or SRAM), radio frequency (RF) device, input/output (I/O) device, system-on-chip (SoC) device, combinations thereof, and other suitable types of devices.

The substrate 202 further comprises inter-layer dielectric (ILD) layers, inter-metal dielectric (IMD) layers and an interconnect structure overlying the integrated circuits. The IMD layers in the interconnect structure include low-k dielectric materials, un-doped silicate glass (USG), fluorine-doped silicate glass (FSG), carbon-doped silicate glass, silicon nitride, silicon oxynitride, or other commonly used materials. The dielectric constants (k value) of the low-k dielectric materials may be less than about 3.9, or less than about 2.3. Metal lines in the interconnect structure may be formed of copper or copper alloys. One skilled in the art will realize the formation details of the interconnect structure.

A contact pad 204 is a top interconnect layer formed in a top-level IMD layer 206, which is a portion of conductive routes and has an exposed surface treated by a planarization process, such as chemical mechanical polishing (CMP), if necessary. Suitable materials for the contact pad 204 may comprise, but are not limited to, for example copper (Cu), aluminum (Al), AlCu, aluminum alloy, copper alloy, or other conductive materials. The contact pad 204 is used in the bonding process to connect the integrated circuits in the respective chip to external features.

It should be noted that a large volume of a conductive pillar over the contact pad 204 provides higher mechanical strength and lower resistance for flip-chip bonding, but may transmit high stress to an interface of the IMD layers and interconnect structure, resulting in delamination between the IMD layers and interconnect structure.

Accordingly, the processing discussed below with reference to FIGS. 3A-9B may use a small-volume conductive via between the contact pad 204 and a conductive pillar to provide enough mechanical strength and lower resistance for flip-chip bonding, but transmit low stress to an interface of the IMD layers and interconnect structure, problems associated with high stress from a large-volume conductive pillar between the IMD layers and interconnect structure may be avoided. This can reduce delamination between the IMD layers and interconnect structure and upgrade device performance.

Referring to FIGS. 3A and 3B, a first conductive layer 208a or 208b is formed over the contact pad 204 and IMD layer 206. FIGS. 3A and 3B show different embodiments of the first conductive layer (208a in FIG. 3A and 208b in FIG. 3B). Any standard seed material may be employed in embodiments of the disclosure. In one embodiment, the first conductive layer 208a or 208b is formed of copper by physical vapor deposition (PVD) or sputtering. In another embodiment, the first conductive layer 208a or 208b may be formed of copper alloys that comprise silver, chromium, nickel, tin, gold, and combinations thereof. The first conductive layer 208a or 208b is deposited to a thickness $t_1$ of between about 0.4 and 0.6 µm.

The method 100 in FIG. 1 continues with step 104 in which a first photo-sensitive layer 302a or 302b is formed over the first conductive layer 208a or 208b. In some embodiments, the photo-sensitive layer 302a or 302b may be a dry film or a photo-resist film. The photo-sensitive layer 302a or 302b may be applied over the first conductive layer 208a or 208b by conventional deposition processes. In one embodiment, the photo-sensitive layer 302a or 302b is formed by laminating a dry film over the first conductive layer 208a or 208b having a thickness of from about 20 µm to about 30 µm. In another embodiment, the photo-sensitive layer 302a or 302b is formed by spin-coating a photo-resist film over the first conductive layer 208a or 208b to obtain a thickness of from about 20 µm to about 30 µm. It is understood that the thickness of the photo-sensitive layer 302a or 302b can be controlled and selected to be a desirable value, this especially in relation to the thickness of the column of a to-be-formed conductive via material.

The method 100 in FIG. 1 continues with step 106 in which the structures in FIGS. 3A and 3B are produced by patterning the first photo-sensitive layer 302a or 302b to form a first opening 402a or 402b over a portion of the contact pad 204. FIGS. 3A and 3B show different embodiments of the first opening (402a in FIG. 3A and 402b in FIG. 3B). In some vertical embodiments, the first opening 402a comprises vertical sidewalls where the first photo-sensitive layer 302a meets the first conductive layer 208a (shown in FIG. 3A). In some tapered embodiments, a tapered structure is formed by under-exposing or under-developing the first photo-sensitive layer 302b, thereby the first opening 402b comprises tapers inward so that there is an acute contact angle where the first photo-sensitive layer 302b meets the first conductive layer 208b (shown in FIG. 3B). In the present embodiment, the first photo-sensitive layer 302a or 302b is patterned by conventional processes to form the first opening 402a or 402b over a portion of the contact pad 204, exposing a portion of the first conductive layer 208a or 208b for defining a window of a conductive via 304a (shown in FIGS. 4A through 9A) or 304b (shown in FIGS. 4B through 9B). In one embodiment, the first opening 402a or 402b has a first width $W_1$ in the range of about 40 to 45 µm. In some embodiments, the patterned first photo-sensitive layer 302a or 302b has an additional opening over the contact pad 204.

The method 100 in FIG. 1 continues with step 108 in which the structure in FIGS. 4A and 4B are produced by plating a conductive via 304a or 304b in the first opening 402*a* or 402*b*. FIGS. 4A and 4B show different embodiments of the conductive via (304*a* in FIG. 4A and 304*b* in FIG. 4B). In the present embodiment, the first opening 402*a* or 402*b* is partially or fully filled with a conductive via 304*a* or 304*b* by suitable formation methods. In the present embodiment, the conductive via 304*a* or 304*b* is formed upward along the first opening 402*a* or 402*b* using the first conductive layer 208*a* or 208*b* as a seed layer.

The conductive via 304*a* or 304*b* comprises a copper via, also referred to as a copper via 304*a* or 304*b*. The copper via 304*a* or 304*b* is intended to comprise substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In some embodiments, the conductive via 304*a* or 304*b* and the first conductive layer 208*a* or 208*b* may be formed from the same material. The formation methods may include sputtering, printing, electro plating, electroless plating, and commonly used chemical vapor deposition (CVD) methods. For example, electro-chemical plating (ECP) is carried out to form the copper via 304*a* or 304*b*. In an exemplary embodiment, the thickness $t_2$ of the conductive via 304*a* or 304*b* is greater than 20 μm. For example, the conductive via 304*a* or 304*b* is of about 20-30 μm thickness, although the thickness may be greater or smaller.

Figure 5B:
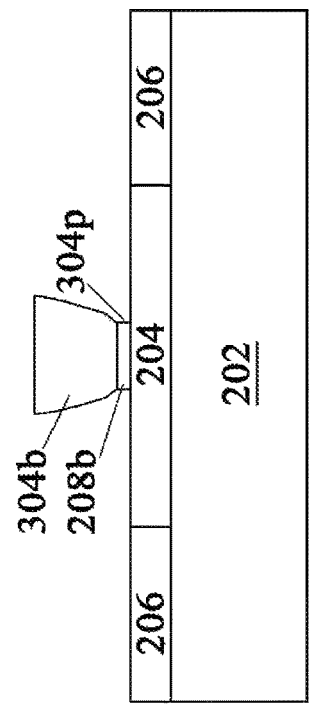
Figure 5A:
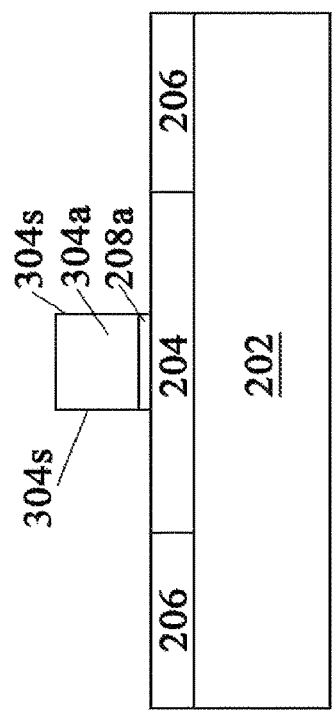

The method 100 in FIG. 1 continues with step 110 in which the structure in FIGS. 5A and 5B is produced by removing the first photo-sensitive layer 302*a* or 302*b*. FIGS. 5A and 5B show different embodiments of the conductive via (304*a* in FIG. 5A and 304*b* in FIG. 5B). In the present embodiment, the first photo-sensitive layer 302*a* or 302*b* may be removed using conventional wet etching or dry etching processes.

Then, using the conductive via 304*a* or 304*b* as a hardmask, FIGS. 5A and 5B also show the substrate 202 of FIGS. 4A and 4B after a portion of the first conductive layer 208*a* or 208*b* is removed to expose the IMD layer 206 and a portion of the contact pad 204. The step of removing a portion of the first conductive layer 208*a* or 208*b* is performed using a wet etching process. For example, the wet etching process comprises removing a portion of the first conductive layer 208*a* or 208*b* in a solution comprising $H_3PO_4$ and $H_2O_2$.

In the vertical embodiment, the first conductive layer 208*a* may be removed until outer edges of the remaining first conductive layer 208*a* are substantially aligned with outer edges of the conductive via 304*a* (shown in FIG. 5A). Structurally, the conductive via 304*a* actually contains the conductive via 304*a* itself and remaining first conductive layer 208*a* located between the conductive via 304*a* and contact pad 204. Further, the conductive via 304*a* comprises substantially vertical sidewalls.

In the tapered embodiment, the first conductive layer 208*b* may be removed until outer edge of the remaining first conductive layer 208*b* is substantially aligned with the outer edge of a bottom portion of the conductive via 304*b* (shown in FIG. 5B). Structurally, the conductive via 304*b* actually contains the conductive via 304*b* itself and remaining first conductive layer 208*b* located between the conductive via 304*b* and contact pad 204. Further, the conductive via 304*b* is narrower at a point 304*p* of a contact with the contact pad 204.

It should be noted that additional etching increases contact resistance, resulting from the reduced contact area between the remaining first conductive layer 208*a* and conductive via 304*a* in the vertical embodiment, or between the remaining first conductive layer 208*b* and conductive via 304*b* in the tapered embodiment.

The method 100 in FIG. 1 continues with step 112 in which the structure in FIGS. 6A and 6B is produced by forming a passivation layer 306*a* or 306*b* over the substrate 202, contact pad 204, and conductive via 304*a* or 304*b*, and exposing the conductive via 304*a* or 304*b* by grinding the passivation layer 306*a* or 306*b* for allowing subsequent conductive pillar bump processes. FIGS. 6A and 6B show different embodiments of the conductive via (304*a* in FIG. 6A and 304*b* in FIG. 6B). In the present embodiment, the passivation layer 306*a* or 306*b* extends over the substrate 202 and has an opening 306*c* or 306*d* with a first width $W_1$ (i.e., almost same as the first width $W_1$ of the first opening 402*a* or 402*b*) over the contact pad 204. Thus, the conductive via 304*a* or 304*b* is within the opening of the passivation layer 306*a* or 306*b*. In some embodiments, the passivation layer 306*a* or 306*b* has an additional opening over the contact pad 204 and an additional conductive via within the additional opening.

In some embodiments, the passivation layer 306 is formed of a non-organic material selected from un-doped silicate glass (USG), silicon nitride, silicon oxynitride, silicon oxide, and combinations thereof. Alternatively, the passivation layer is formed of a polymer layer, such as an epoxy, polyimide, benzocyclobutene (BCB), polybenzoxazole (PBO), and the like, although other relatively soft, often organic, dielectric materials can also be used. In one embodiment, the passivation layer 306 may be formed using a chemical vapor deposition (CVD), high density plasma CVD (HDP CVD), sub-atmospheric CVD (SACVD), physical vapor deposition (PVD), or spin-on process.

Figures 7A, 7B:
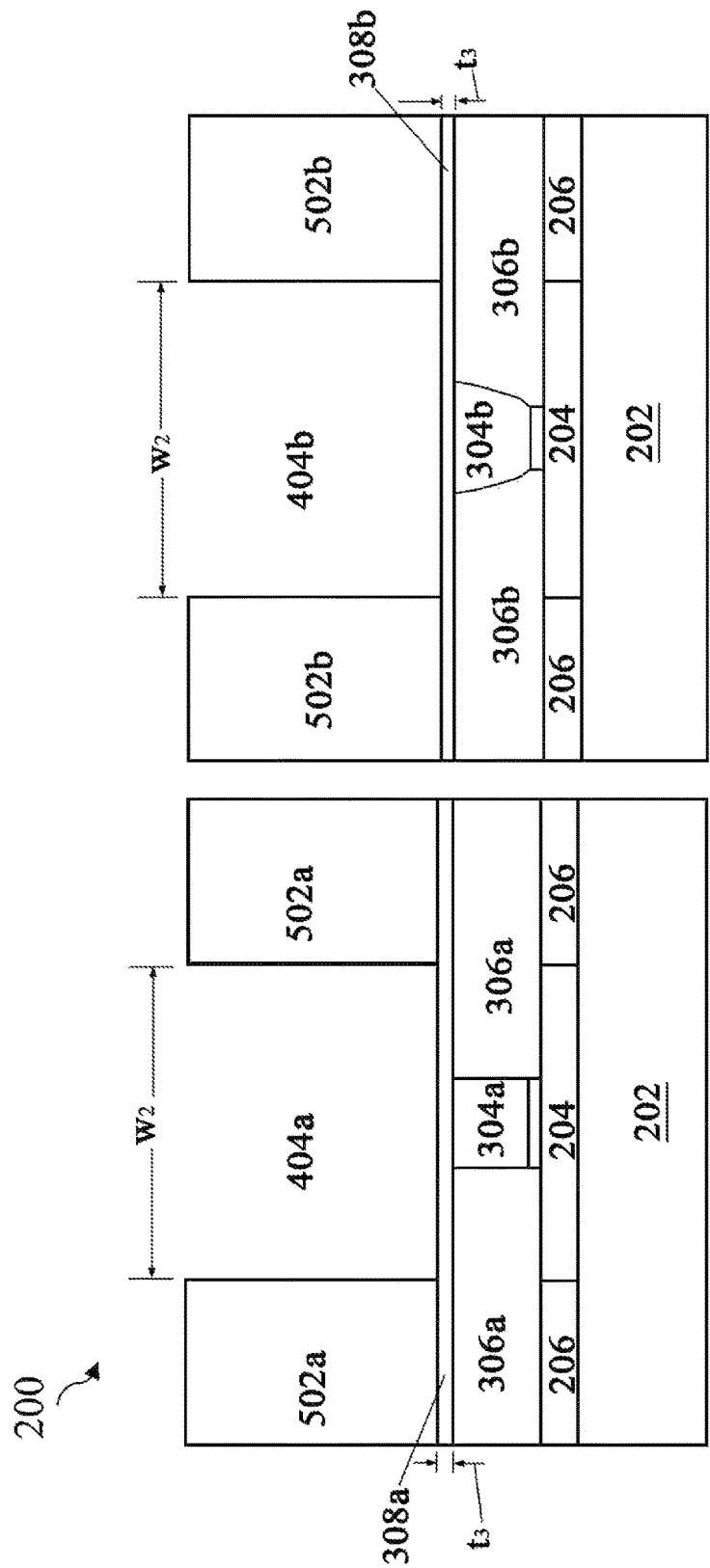

Referring to FIGS. 7A and 7B, a second conductive layer 308*a* or 308*b* is formed over the conductive via 304*a* or 304*b* and passivation layer 306*a* or 306*b*. FIGS. 7A and 7B show different embodiments of the conductive via (304*a* in FIG. 7A and 304*b* in FIG. 7B). Any standard seed material may be employed in embodiments of the invention. In one embodiment, the second conductive layer 308*a* or 308*b* is formed of copper by physical vapor deposition (PVD) or sputtering. In another embodiment, the second conductive layer 308*a* or 308*b* may be formed of copper alloys that comprise silver, chromium, nickel, tin, gold, and combinations thereof. The second conductive layer 308*a* or 308*b* is deposited to a thickness $t_3$ of between about 0.4 and 0.6 μm.

The method 100 in FIG. 1 continues with step 114 in which a second photo-sensitive layer 502*a* or 502*b* is formed over the second conductive layer 308*a* or 308*b*, thereby formed over the conductive via 304*a* or 304*b* and passivation layer 306*a* or 306*b*. The second photo-sensitive layer 502*a* or 502*b* may be a dry film or a photo-resist film. The second photo-sensitive layer 502*a* or 502*b* may be applied over the second conductive layer 308*a* or 308*b* by conventional deposition processes. In one embodiment, the second photo-sensitive layer 502*a* or 502*b* is formed by laminating a dry film over the second conductive layer 308*a* or 308*b* having a thickness of from about 55 μm to about 60 μm. In another embodiment, the second photo-sensitive layer 502*a* or 502*b* is formed by spin-coating a photo-resist film over the second conductive layer 308*a* or 308*b* to obtain a thickness of from about 55 μm to about 60 μm. It is understood that the thickness of the second photo-sensitive layer 502*a* or 502*b* can be controlled and selected to be a desirable value, this especially in relation to the thickness of the column of a to-be-formed conductive pillar bump material.

For defining a window of a conductive pillar 504a or 504b (shown in FIGS. 8A through 9B), the method 100 in FIG. 1 continues with step 114 in which the structures in FIGS. 7A and 7B are produced by patterning the second photo-sensitive layer 502a or 502b to form a second opening 404a or 404b larger than and completely exposing the conductive via 304a or 304b. FIGS. 7A and 7B show different embodiments of the conductive via (304a in FIG. 7A and 304b in FIG. 7B). In one embodiment, the second opening 404a or 404b has a second width $W_2$ in the range of about 80 to 90 μm.

The method 100 in FIG. 1 continues with step 118 in which the structure in FIGS. 8A and 8B is produced by plating a conductive pillar 504a or 504b in the second opening 404a or 404b. FIGS. 8A and 8B show different embodiments of the conductive via (304a in FIG. 8A and 304b in FIG. 8B). In the present embodiment, the second opening 404a or 404b is partially or fully filled with the conductive pillar 504a or 504b by suitable formation methods. In the present embodiment, the conductive pillar 504a or 504b is formed upward along the second opening 404a or 404b using the second conductive layer 308a or 308b as a seed layer.

The conductive pillar 504a or 504b comprises a copper pillar, also referred to as a copper pillar 504a or 504b. The copper pillar 504a or 504b is intended to comprise substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The conductive pillar 504a or 504b and the second conductive layer 308a or 308b may be formed from the same material. The formation methods may include sputtering, printing, electro plating, electroless plating, and commonly used chemical vapor deposition (CVD) methods. For example, electro-chemical plating (ECP) is carried out to form the copper pillar 504a or 504b. In an exemplary embodiment, the thickness $t_4$ of the conductive pillar 504a or 504b is greater than 55 μm. For example, the conductive pillar 504a or 504b is about 55-60 μm thick, although the thickness may be greater or smaller.

Figures 9A, 9B:
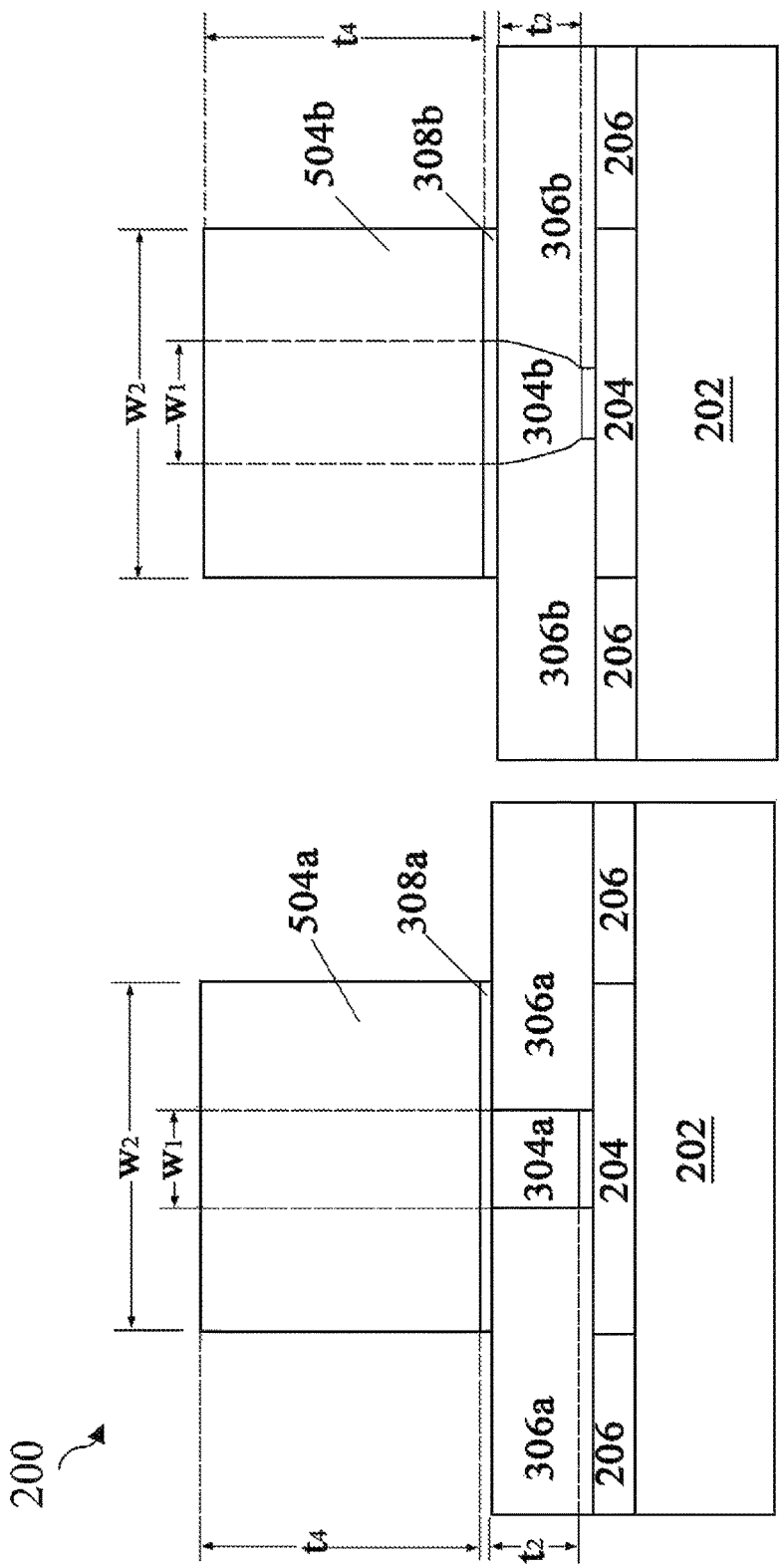

The method 100 in FIG. 1 continues with step 120 in which the structure in FIGS. 9A and 9B is produced by removing the second photo-sensitive layer 502a or 502b. FIGS. 9A and 9B show different embodiments of the conductive via (304a in FIG. 9A and 304b in FIG. 9B). In the present embodiment, the second photo-sensitive layer 502a or 502b may be removed using conventional wet etching or dry etching processes.

Then, using the conductive pillar 504a or 504b as a hard-mask, FIGS. 9A and 9B also show the substrate 202 of FIGS. 8A and 8B after a portion of the second conductive layer 308a or 308b is removed to expose the passivation layer 306a or 306b. The step of removing a portion of the second conductive layer 308a or 308b is performed using a wet etching process. For example, the wet etching process comprises removing a portion of the second conductive layer 308a or 308b in a solution comprising $H_3PO_3$ and $H_2O_2$.

In the present embodiment, the second conductive layer 308a or 308b may be removed until outer edges of the remaining second conductive layer 308a or 308b is substantially aligned with outer edges of the conductive pillar 504a or 504b. It should be noted that additional etching increases contact resistance, resulting from the reduced contact area between the remaining second conductive layer 308a and conductive pillar 504a, or between the remaining second conductive layer 308b and conductive pillar 504b. Structurally, the conductive pillar 504a actually contains the conductive pillar 504a itself and remaining second conductive layer 308a located between the conductive pillar 504a and conductive via 304a. Structurally, the conductive pillar 504b actually contains the conductive pillar 504b itself and remaining second conductive layer 308b located between the conductive pillar 504b and conductive via 304b.

In the present embodiment, the conductive pillar 504a or 504b has a second width $W_2$ (i.e., almost same as the second width $W_2$ of the second opening 404a or 404b) completely covering the conductive via 304a or 304b, wherein a ratio of the first width $W_1$ of conductive via 304a or 304b to the second width $W_2$ of the conductive pillar 504a or 504b is from about 0.15 to 0.55, or a ratio of the first width $W_1$ of the opening 306c or 306d of the conductive via 304a or 304b to the second width $W_2$ of the conductive pillar 504a or 504b is from about 0.15 to 0.55. In some embodiments, a ratio of the thickness $t_2$ of the conductive via 304a or 304b to the thickness $t_4$ of the conductive pillar 505a or 505b is from about 0.33 to 0.55. In at least one embodiment, the conductive via 304a or 304b and the conductive pillar 505a or 505b are formed from the same material. In at least one embodiment, the conductive via 304a or 304b and the conductive pillar 505a or 505b are formed from different materials.

Figure 10:
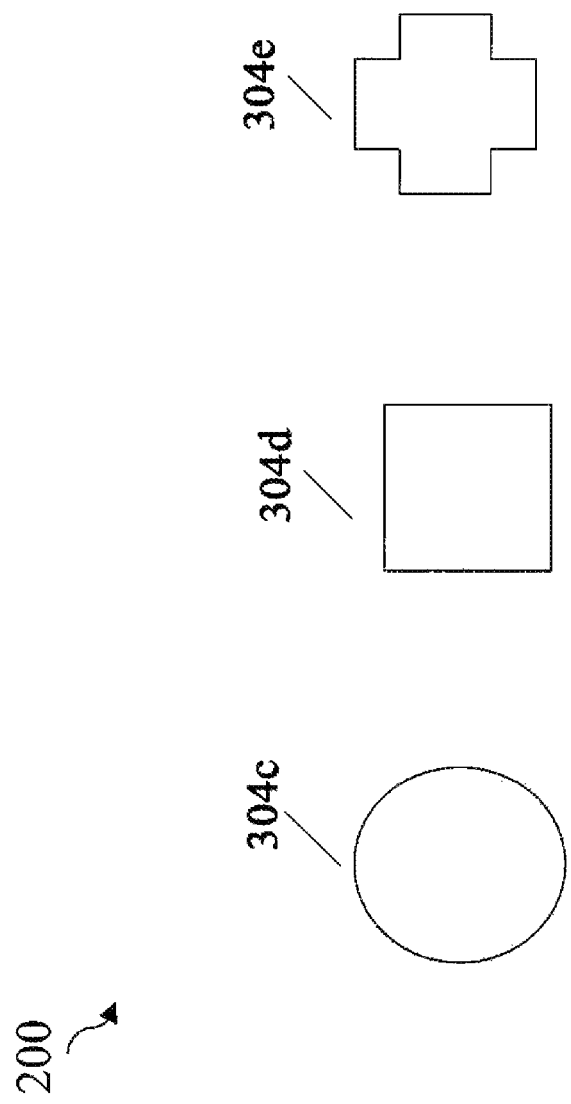
FIG. 10 shows schematic top-down views of a conductive via of a semiconductor device according to various aspects of the present disclosure.

FIG. 10 shows schematic top-down views of the conductive via 304a or 304b of the semiconductor device 200 according to various aspects of the present disclosure. The top-down view of the conductive via 304a or 304b comprises a shape selected from circle 304c, square 304d, and cross 304e.

Therefore, a semiconductor device 200 comprises a substrate 202; a contact pad 204 over the substrate 202; a passivation layer 306a or 306b extending over the substrate 202 and having an opening 306c or 306d with a first width $W_1$ over the contact pad 204; a conductive via 304a or 304b within the opening 306c or 306d; and a conductive pillar 504a or 504b having a second width $W_2$ completely covering the conductive via 304a or 304b, wherein a ratio of the first width $W_1$ to the second width $W_2$ is from about 0.15 to 0.55. The passivation layer 306a or 306b may have an additional opening over the contact pad 204 and an additional conductive via within the additional opening. Therefore, Applicant's method can reduce delamination between the IMD layers and interconnect structure and upgrade device performance.

Then, subsequent processes, including flip-chip processing, are performed after forming the semiconductor device 200 to complete the IC fabrication.

One aspect of this description relates to a semiconductor device. The semiconductor device includes a substrate and a contact pad over the substrate. The semiconductor device further includes a conductive via electrically connected to the contact pad. The conductive via includes a conductive via layer having a first thickness, and a first conductive layer, wherein the first conductive layer is between the contact pad and the conductive via layer. The semiconductor device further includes a conductive pillar electrically connected to the conductive via. The conductive pillar includes a conductive pillar layer having a second thickness, and a second conductive layer having outer edges substantially aligned with outer edges of the conductive pillar layer, wherein the second conductive layer is between the conductive via layer and the conductive pillar layer. A ratio of the first thickness to the second thickness ranges from about 0.33 to about 0.55.

Another aspect of this description relates to a semiconductor device. The semiconductor device includes a conductive via electrically connected to a contact pad, wherein the conductive via has tapered sidewalls, and the conductive via has a first thickness. The semiconductor device further includes a conductive pillar electrically connected to the conductive via, wherein the conductive pillar completely covers the conductive via in a plan view, the conductive pillar has a second thickness, and a ratio of the first thickness to the second thickness ranges from about 0.33 to about 0.55. The semiconductor device further includes a conductive layer between the conductive via and the conductive pillar, wherein sidewalls of the conductive layer are substantially aligned with sidewalls of the conductive pillar.

Still another aspect of this description relates to a semiconductor device. The semiconductor device includes an inter-metal dielectric (IMD) layer over a substrate, and a contact pad in the IMD layer. The semiconductor device further includes a conductive via electrically connected to the contact pad, wherein the conductive via has a first width, and the conductive via has a first thickness. The semiconductor device further includes a conductive pillar electrically connected to the conductive via, wherein the conductive has a second width greater than the first width, the conductive pillar has a second thickness, and a ratio of the first thickness to the second thickness ranges from about 0.33 to about 0.55.

While this disclosure has described the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
   a substrate;
   a contact pad over the substrate;
   a conductive via electrically connected to the contact pad, the conductive via comprising:
      a conductive via layer having a first thickness, and
      a first conductive layer, wherein the first conductive layer is between the contact pad and the conductive via layer; and
   a conductive pillar electrically connected to the conductive via, the conductive pillar comprising:
      a conductive pillar layer having a second thickness, and
      a second conductive layer directly contacting the conductive pillar layer and having outer edges level with outer edges of the conductive pillar layer along an entire length of the conductive pillar, wherein the second conductive layer is between the conductive via layer and the conductive pillar layer, and a thickness of the second conductive layer is different from the second thickness,
   wherein a ratio of the first thickness to the second thickness ranges from about 0.33 to about 0.55.

2. The semiconductor device of claim 1, wherein the first conductive layer has a thickness ranging from about 0.4 micrometers (μm) to about 0.6 μm.

3. The semiconductor device of claim 1, wherein the second conductive layer has a thickness ranging from about 0.4 μm to about 0.6 μm.

4. The semiconductor device of claim 1, wherein the conductive via layer has a first width, closest to the second conductive layer, ranging from about 40 μm to about 45 μm.

5. The semiconductor device of claim 4, wherein the conductive via layer has a second width, closest to the first conductive layer, less than the first width.

6. The semiconductor device of claim 1, wherein the first thickness is greater than 20 μm.

7. The semiconductor device of claim 1, wherein the second thickness is greater than 55 μm.

8. A semiconductor device comprising:
   a conductive via electrically connected to a contact pad, wherein the conductive via has tapered sidewalls, and the conductive via has a first thickness;
   a conductive pillar electrically connected to the conductive via, wherein the conductive pillar completely covers the conductive via in a plan view, the conductive pillar has a second thickness, and a ratio of the first thickness to the second thickness ranges from about 0.33 to about 0.55;
   a conductive layer between the conductive via and the conductive pillar, wherein sidewalls of the conductive layer are substantially aligned with sidewalls of the conductive pillar, and the conductive layer is a single layer; and
   a passivation layer over the contact pad, wherein the conductive via is in the passivation layer, and the conductive layer extends along a top-most surface of the passivation layer.

9. The semiconductor device of claim 8, wherein the contact pad is a top interconnect layer over a substrate.

10. The semiconductor device of claim 8, wherein a shape of the conductive via is selected from the group consisting of a circle, a square and a cross.

11. The semiconductor device of claim 8, wherein the first thickness ranges from about 20 micrometer (μm) to about 30 μm.

12. The semiconductor device of claim 8, wherein the second thickness ranges from about 55 μm to about 60 μm.

13. The semiconductor device of 8, wherein a ratio of a maximum width of the conductive via to a width of the conductive pillar ranges from about 0.15 to about 0.55.

14. The semiconductor device of claim 8, further comprising an inter-metal dielectric (IMD) layer surrounding the contact pad.

15. A semiconductor device comprising:
   an inter-metal dielectric (IMD) layer over a substrate;
   a contact pad in the IMD layer;
   a conductive via electrically connected to the contact pad, wherein the conductive via has a first width, and the conductive via has a first thickness;
   a conductive pillar electrically connected to the conductive via, wherein the conductive pillar has a second width greater than the first width, the conductive pillar has a second thickness, and a ratio of the first thickness to the second thickness ranges from about 0.33 to about 0.55; and
   a conductive layer directly contacting the conductive pillar, wherein sidewalls of the conductive layer are coplanar with sidewalls of the conductive pillar along an entirety of the conductive pillar.

16. The semiconductor device of claim 15, wherein the conductive layer is between the conductive via and the conductive pillar.

17. The semiconductor device of claim 15, further comprising a second conductive layer between the conductive via and the contact pad.

18. The semiconductor device of claim 15, further comprising a passivation layer surrounding the conductive via.

19. The semiconductor device of claim 18, wherein a portion of the conductive pillar overlays a portion of the passivation layer.

20. The semiconductor device of claim 15, wherein a ratio of the first width to the second width ranges from about 0.15 to about 0.55.

\* \* \* \* \*